(12) United States Patent
Kammler et al.

(10) Patent No.: US 7,354,838 B2
(45) Date of Patent: Apr. 8, 2008

(54) TECHNIQUE FOR FORMING A CONTACT INSULATION LAYER WITH ENHANCED STRESS TRANSFER EFFICIENCY

(75) Inventors: Thorsten Kammler, Ottendorf-Okrilla (DE); Andy Wei, Dresden (DE); Markus Lenski, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 235 days.

(21) Appl. No.: 11/288,673

(22) Filed: Nov. 29, 2005

(65) Prior Publication Data

US 2006/0246641 A1   Nov. 2, 2006

(30) Foreign Application Priority Data

Apr. 29, 2005   (DE) ............. 10 2005 020 133

(51) Int. Cl.
*H01L 21/336* (2006.01)
(52) U.S. Cl. .............. 438/303; 438/510; 438/649
(58) Field of Classification Search .......... 438/231, 438/232, 304, 558, 562–564, 197, 299, 301, 438/510, 303–307, 545, 554, 559
See application file for complete search history.

(56) References Cited

U.S. PATENT DOCUMENTS

| | | | | |
|---|---|---|---|---|
| 5,510,648 A * | 4/1996 | Davies et al. | ............. | 257/657 |
| 5,841,168 A * | 11/1998 | Gardner et al. | ............. | 257/344 |
| 5,960,270 A * | 9/1999 | Misra et al. | ............. | 438/197 |
| 5,994,747 A * | 11/1999 | Wu | ............. | 257/408 |
| 6,066,567 A * | 5/2000 | En et al. | ............. | 438/706 |
| 6,087,271 A * | 7/2000 | En et al. | ............. | 438/745 |
| 6,136,636 A * | 10/2000 | Wu | ............. | 438/231 |
| 6,165,826 A * | 12/2000 | Chau et al. | ............. | 438/231 |
| 6,271,133 B1 * | 8/2001 | Lim et al. | ............. | 438/683 |
| 6,326,664 B1 * | 12/2001 | Chau et al. | ............. | 257/344 |
| 6,335,252 B1 | 1/2002 | Oishi et al. | ............. | 438/303 |
| 6,372,589 B1 * | 4/2002 | Yu | ............. | 438/304 |
| 6,573,172 B1 * | 6/2003 | En et al. | ............. | 438/626 |
| 6,677,201 B1 * | 1/2004 | Bu et al. | ............. | 438/257 |
| 6,770,540 B2 * | 8/2004 | Ko | ............. | 438/303 |
| 6,878,597 B2 * | 4/2005 | Kim | ............. | 438/303 |
| 6,969,646 B2 * | 11/2005 | Quek et al. | ............. | 438/231 |
| 7,022,596 B2 * | 4/2006 | Zhong et al. | ............. | 438/595 |
| 2002/0192868 A1* | 12/2002 | Kim | ............. | 438/112 |
| 2003/0011017 A1* | 1/2003 | Lee et al. | ............. | 257/314 |
| 2003/0032239 A1* | 2/2003 | Rabkin et al. | ............. | 438/257 |
| 2003/0040158 A1 | 2/2003 | Saitoh | ............. | 438/279 |
| 2003/0183881 A1* | 10/2003 | Lee et al. | ............. | 257/382 |
| 2004/0072435 A1* | 4/2004 | Quek | ............. | 438/691 |
| 2004/0104405 A1 | 6/2004 | Huang et al. | ............. | 257/199 |

(Continued)

OTHER PUBLICATIONS

PCT Search Report, PCT/US2006/014627, Sep. 5, 2006.

*Primary Examiner*—George Fourson
*Assistant Examiner*—John M. Parker
(74) *Attorney, Agent, or Firm*—Williams, Morgan & Amerson, P.C.

(57) ABSTRACT

By removing an outer spacer, used for the formation of highly complex lateral dopant profiles, prior to the formation of metal silicide, a high degree of process compatibility with conventional processes is obtained, while at the same time a contact liner layer may be positioned more closely to the channel region, thereby allowing a highly efficient stress transfer mechanism for creating a corresponding strain in the channel region.

19 Claims, 2 Drawing Sheets

U.S. PATENT DOCUMENTS

| | | | |
|---|---|---|---|
| 2004/0235229 A1 | 11/2004 | Hokazono | 438/199 |
| 2004/0251479 A1 | 12/2004 | Tsutsui et al. | 257/249 |
| 2004/0266124 A1 | 12/2004 | Roy et al. | 438/307 |
| 2005/0040472 A1 | 2/2005 | Oh et al. | 257/382 |
| 2005/0186722 A1* | 8/2005 | Cheng et al. | 438/199 |
| 2005/0266639 A1* | 12/2005 | Frohberg et al. | 438/257 |
| 2007/0194388 A1* | 8/2007 | Tsutsui et al. | 257/369 |

* cited by examiner

TECHNIQUE FOR FORMING A CONTACT INSULATION LAYER WITH ENHANCED STRESS TRANSFER EFFICIENCY

BACKGROUND OF THE INVENTION

1. Field of the Invention

Generally, the present invention relates to the formation of integrated circuits, and, more particularly, to the formation of a contact insulation layer in the presence of spacer elements during the manufacturing of a field effect transistor.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source regions.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of MOS transistors. Thus, the reduction of the channel length, and associated therewith the reduction of the channel resistivity, renders the channel length a dominant design criterion for accomplishing an increase in the operating speed of the integrated circuits.

The reduction of the transistor dimensions, however, entails a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length also requires reducing the depth of the drain and source regions with respect to the interface formed by the gate insulation layer and the channel region, thereby requiring sophisticated implantation techniques. According to other approaches, epitaxially grown regions are formed with a specified offset to the gate electrode, which are referred to as raised drain and source regions, to provide increased conductivity of the raised drain and source regions, while at the same time maintaining a shallow PN junction with respect to the gate insulation layer.

Irrespective of the technological approach used, sophisticated spacer techniques are necessary to create the highly complex dopant profile and to serve as a mask in forming metal silicide regions in the gate electrode and the drain and source regions in a self-aligned fashion. Since the continuous size reduction of the critical dimensions, i.e., the gate length of the transistors, necessitates the adaptation and possibly the new development of process techniques concerning the above-identified process steps, it has been proposed to enhance device performance of the transistor elements by increasing the charge carrier mobility in the channel region for a given channel length. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, thereby making a reduction of the dopant concentration a less attractive approach unless other mechanisms are developed to adjust a desired threshold voltage.

Second, the lattice structure in the channel region may be modified, for instance by creating tensile or compressive strain, which results in a modified mobility for electrons and holes. For example, creating tensile strain in the channel region increases the mobility of electrons, wherein, depending on the magnitude of the tensile strain, an increase in mobility of up to 20% may be obtained, which, in turn, directly translates into a corresponding increase in the conductivity. On the other hand, compressive stress in the channel region may increase the mobility of holes, thereby providing the potential for enhancing the performance of P-type transistors.

Consequently, it has been proposed to introduce, for instance, a silicon/germanium layer or a silicon/carbon layer in or below the channel region to create tensile or compressive stress. Although the transistor performance may be considerably enhanced by the introduction of stress-creating layers in or below the channel region, significant efforts have to be made to implement the formation of corresponding stress layers into the conventional and well-approved CMOS technique. For instance, additional epitaxial growth techniques have to be developed and implemented into the process flow to form the germanium- or carbon-containing stress layers at appropriate locations in or below the channel region. Hence, process complexity is significantly increased, thereby also increasing production costs and the potential for a reduction in production yield.

Another promising approach is the creation of stress in the insulating layer, which is formed after the formation of the transistor elements to embed the transistors and which receives metal contacts to provide the electrical connection to the drain/source regions and the gate electrode of the transistors. Typically, this insulation layer comprises at least one etch stop layer or liner and a further dielectric layer that may selectively be etched with respect to the etch stop layer or liner. In the following, this insulation layer will be referred to as the contact layer and the corresponding etch stop layer will be denoted as the contact liner layer. In order to obtain an efficient stress transfer mechanism to the channel region of the transistor for creating strain therein, the contact liner layer that is located in the vicinity of the channel region has to be positioned closely to the channel region. In advanced transistor architectures requiring a triple spacer approach for achieving the highly complex lateral dopant profile, a significant amount of the stress of the contact liner layer is, however, "absorbed" by the spacers, thereby making conventional triple spacer approaches, despite their advantages with respect to process complexity compared to epitaxially grown stress layers, currently less attractive for creating strain in channel regions of advanced transistors.

In view of the above-described situation, there exists a need for an improved technique that enables the creation of stress in the channel region without requiring complex and expensive epitaxial growth techniques.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of a contact liner layer, i.e., an etch stop layer of a dielectric layer stack used to embed transistor elements to form electrical contacts therethrough, in close proximity to the channel regions of respective transistor elements. Thus, the contact liner layer may be formed or may be treated to exhibit a specified internal stress that may then be highly efficiently transferred to the channel region to create there a corresponding strain, thereby providing the potential for improving charge carrier mobility and thus overall performance of the transistor elements.

According to one illustrative embodiment of the present invention, a method comprises forming a transistor element comprising a gate electrode structure including at least an inner spacer element and an outer spacer element. Moreover, the outer spacer element is then removed and a contact liner layer is formed above the transistor element.

According to another illustrative embodiment of the present invention, a method comprises forming a first transistor element having a first gate electrode structure including at least an inner and an outer spacer element. Furthermore, a second transistor element is formed, which has a second gate electrode structure including at least an inner and an outer spacer element. The method further comprises removing the outer spacer elements of the first and second gate electrode structures. Moreover, a first contact liner layer having a first internal stress is formed above the first transistor element and a second contact liner layer having a second internal stress is formed above the second transistor element.

BRIEF DESCRIPTION OF THE DRAWINGS

The invention may be understood by reference to the following description taken in conjunction with the accompanying drawings, in which like reference numerals identify like elements, and in which.

Figure 1A:
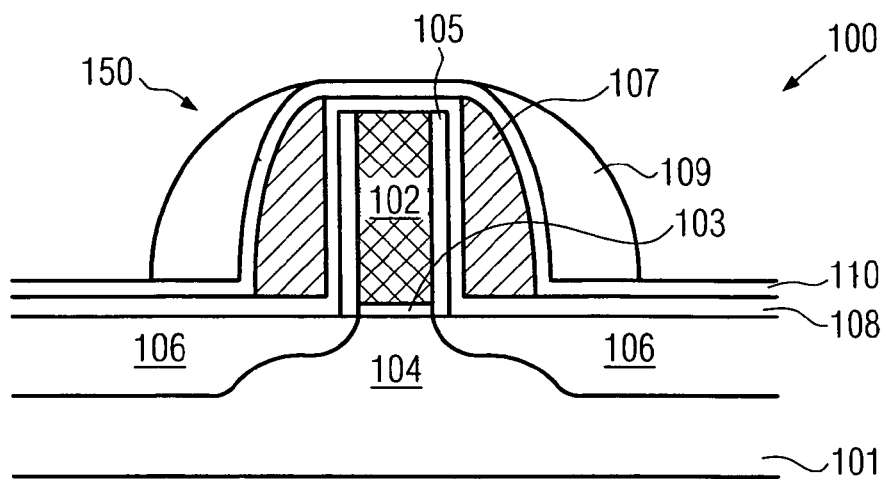
FIGS. 1a-1e schematically illustrate cross-sectional views of a transistor element during various manufacturing stages in forming a contact liner layer close to the channel region in accordance with further illustrative embodiments.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention addresses the problem of efficiently transferring stress from the contact liner layer to the channel region, while nevertheless maintaining a high degree of compatibility with conventional processes. For this purpose, spacer elements are provided having a size, as required by implantation and silicide requirements, to take into account the large diffusivity of implant species like boron and phosphorous, whereas, however, the effective distance from the drain and source regions may be significantly reduced in that the outermost spacer is removed prior to the formation of the contact liner layer. Hereby, the removal process for the outermost spacer element may be designed so as to not unduly affect any silicide regions that are to be formed on the gate electrodes and the drain and source regions. With reference to the accompanying drawings, further illustrative embodiments of the present invention will now be described in more detail.

FIGS. 1a-1e schematically show a semiconductor device 100 in cross-sectional view. The semiconductor device 100 comprises a substrate 101 which may represent any appropriate substrate for the formation of circuit elements of integrated circuits. For example, the substrate 101 may represent a bulk silicon substrate, a silicon-on-insulator (SOI) substrate, or any other appropriate substrate having formed thereon a crystalline semiconductor layer that is appropriate for the formation of transistor elements therein. Formed in and on the substrate 101 is a transistor element 150 in an intermediate manufacturing stage, in which the transistor element 150 comprises a gate electrode 102 that is formed on a gate insulation layer 103, which separates the gate electrode 102 from a channel region 104 that may represent a portion of the substrate 101 or of any appropriate semiconductor layer formed thereon. The transistor element 150 may represent any type of field effect transistor, such as an N-channel transistor or a P-channel transistor having a gate length, i.e., the horizontal dimension of the gate electrode 102 in FIG. 1a, of 100 nm and significantly less, as may be encountered in highly complex silicon-based integrated circuits, such as CPUs, memory chips, ASICs (application specific ICs) and the like. Consequently, the gate insulation layer 103 may have an appropriate thickness that may range from approximately 1.2 nm or even less to several nm, depending on the overall dimension of the gate electrode 102. It should be appreciated that the present invention is highly advantageous in combination with extremely scaled transistor elements having a gate length of approximately 100 nm or even of approximately 50 nm and less, whereas, in principle, the present invention may also be readily applied to less sophisticated transistor elements.

The semiconductor device 100 further comprises an offset spacer 105 formed on the sidewalls of the gate electrode 102. The offset spacer 105 may be comprised of any appropriate dielectric material, such as silicon dioxide, silicon nitride, silicon oxynitride and the like. A width of the offset spacer 105 is selected in accordance with process requirements for forming the lateral dopant profile of extension regions 106 formed within the substrate 101 adjacent to the channel region 104. The semiconductor device 100 may further comprise an inner spacer element 107 formed adjacent to the sidewalls of the gate electrode 102, wherein the inner spacer element 107 may be separated from the offset spacer 105 by a liner 108 that is comprised of a dielectric material having a moderately high etch selectivity with respect to the material of the inner spacer 107. In one illustrative embodiment, the inner spacer 107 may be comprised of silicon nitride and the liner 108, which is also formed on horizontal portions of the substrate 101 and on top of the gate electrode 102, may be comprised of silicon dioxide. For such a material composition, a plurality of well-established anisotropic etch recipes with high etch selectivity are known. In other embodiments, the inner spacer 107 may be comprised of silicon dioxide or silicon oxynitride, while the liner 108 may be comprised of silicon nitride so as to again exhibit a moderately high etch selectivity with respect to well-established anisotropic etch recipes. The device 100 may further comprise an outer spacer element 109 having a width that is selected to meet the process requirements for an ion implantation process to be performed subsequently to form deep drain and source regions adjacent to the extension regions 106. The outer spacer element 109 is separated from the inner spacer 107 by an etch stop layer 110, which also covers horizontal portions of the liner 108 and which is comprised of a material exhibiting a moderately high etch selectivity with respect to the material of the outer spacer 109. In one illustrative embodiment, the outer spacer 109 may be comprised of silicon dioxide, whereas the etch stop layer 110 may be comprised of silicon nitride. In other embodiments, different material compositions for the outer spacer 109 and the etch stop layer 110 may be provided, as long as the required etch selectivity between the two materials is maintained. For example, in one embodiment, the outer spacer 109 may be comprised of silicon nitride, whereas the etch stop layer 110 may be comprised of silicon dioxide.

A typical process flow for forming the semiconductor device 100, as shown in FIG. 1a, may comprise the following processes. After formation of an appropriate gate insulation material layer and a gate electrode material, for instance in the form of silicon dioxide, nitrogen-enriched silicon dioxide for the gate insulation layer 104 and pre-doped or undoped polysilicon for the gate electrode 102, a well-established patterning process may be performed on the basis of advanced photolithography and etch techniques. After the patterning of the gate insulation layer 104 and the gate electrode 102, the offset spacer 105 may be formed by depositing an appropriate dielectric material, such as silicon dioxide, silicon nitride and the like, with a predefined thickness that substantially corresponds to the width of the offset spacer 105. Thereafter, an appropriate anisotropic etch process may be performed to remove excess material on horizontal portions of the device 100, such as at the top surface of the gate electrode 102 and on exposed portions of the substrate 101. Subsequently, an ion implantation sequence may be performed to form a portion of the extension regions 106, wherein other implantation cycles may be carried out to form a pre-amorphized region (not shown) within the substrate 101 and/or a halo region (not shown) in order to obtain the required implantation conditions and dopant profile for forming the extension regions 106 and deep drain and source regions, as will be described later on. Thereafter, the liner 108 may be formed by depositing an appropriate material which, in one embodiment, may be silicon dioxide that may be deposited on the basis of well-established plasma enhanced chemical vapor deposition (PECVD) techniques. In other embodiments, the liner 108 may be deposited in the form of silicon nitride. Subsequently, a spacer material for the inner spacer 107 may be deposited by PECVD techniques, wherein the material composition of the liner 108 with respect to the inner spacer 107 is selected to exhibit a high etch selectivity. In one illustrative embodiment, the inner spacer material 107 may comprise silicon nitride, when the liner 108 is substantially comprised of silicon dioxide. In other embodiments, the inner spacer material 107 may be comprised of silicon dioxide or silicon oxynitride, while the liner 108 may be formed of silicon nitride.

Thereafter, well-established anisotropic etch recipes may be used to remove excess material of the spacer material, thereby forming the inner spacer 107, while the anisotropic etch process reliably stops on and in the liner 108. Thereafter, a further appropriate implantation process may be performed in accordance with device requirements to finely tune the lateral dopant profile of the extension regions 106. Next, the etch stop layer 110 may conformally be deposited, for instance, in one embodiment in the form of a silicon nitride layer, and thereafter a spacer material, in this embodiment comprised of silicon dioxide, may be deposited and anisotropically etched to form the outer spacer element 109. Corresponding anisotropic etch recipes are well established in the art. In other illustrative embodiments, the etch stop layer 110 may be deposited as a silicon dioxide layer, while the outer spacer 109 may be formed from a silicon nitride layer.

Figure 1B:
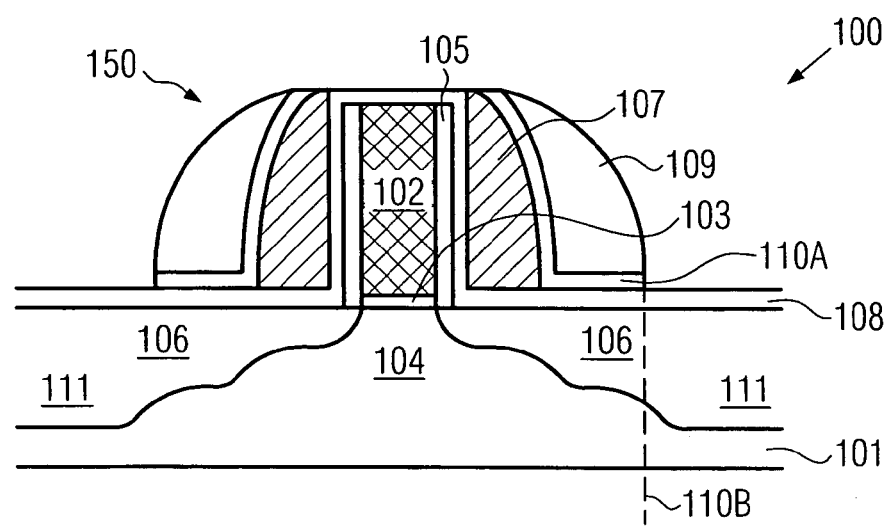

FIG. 1b schematically shows the semiconductor device 100 in a further advanced manufacturing stage. As shown, a portion of the etch stop layer 110, formed above the gate electrode 102 and above exposed horizontal portions of the substrate 101 (FIG. 1a), is removed. The residue of the etch stop layer 110 is now indicated by 110a. Moreover, deep source and drain regions 111 are formed next to the extension regions 106.

The device 100 as shown in FIG. 1b may be formed by an etch step, which may be designed in particular embodiments as a substantially anisotropic etch process for selectively removing exposed portions of the etch stop layer 110. Hereby, well-established selective etch recipes may be used, wherein the etch process may reliably stop in and on the liner 108, when the etch stop layer 110 and the liner 108 are formed of different materials exhibiting a certain degree of etch selectivity. Due to this etch process for removing the exposed horizontal portions of the etch stop layer 110, the lateral extension, indicated as 110b, of the etch stop layer 110a is defined so as to substantially correspond to the width of the outer spacer element 109. Moreover, the corresponding layer stack, including the layers 110 and 108 in FIG. 1a, during a subsequent implantation for forming the deep drain and source regions 111 and also for further doping the gate electrode 102, is reduced, thereby facilitating the control of the ion implantation sequence for forming the source/drain regions 111. After the implantation, a rapid thermal anneal process may be performed to activate the dopants within the extension regions 106 and the deep drain/source regions 111 and also to re-crystallize crystalline damage caused by the previous pre-amorphization and other implantation processes.

Figure 1C:
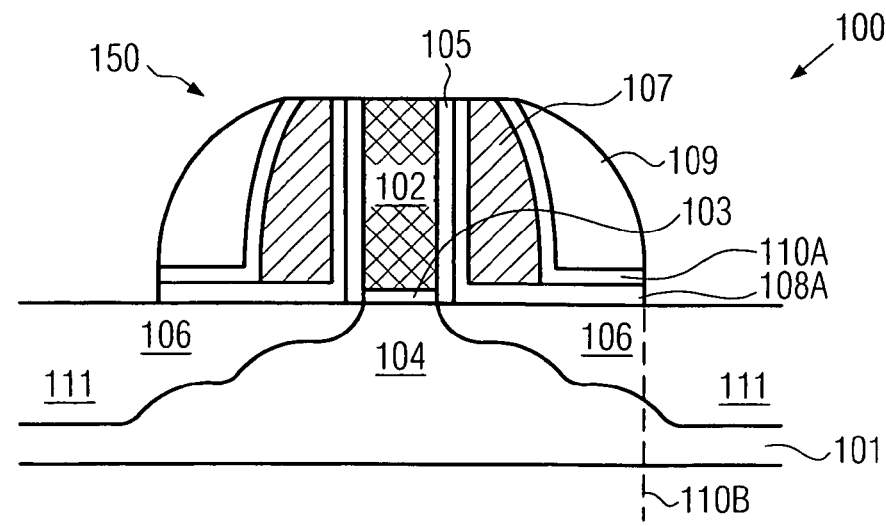

FIG. 1c schematically shows the semiconductor device 200 in accordance with alternative embodiments for forming the deep source/drain regions 111 and for determining the lateral extension 110b of the etch stop layer 110a. In FIG. 1c, the etch process for forming the etch stop layer 110a is configured such that exposed horizontal portions of the liner 108 are also removed, thereby forming the residue 108a. Thus, the corresponding etch sequence is designed to reliably stop on the semiconductor material of the substrate 101, which is substantially comprised of silicon in particular embodiments of the present invention. Consequently, the gate electrode 102 and corresponding regions of the substrate 101 are exposed during the subsequent implantation process for forming the deep drain/source regions 111. Thereafter, a rapid thermal anneal process may be carried out, as is also described with reference to FIG. 1b.

In highly advanced transistor elements, usually the conductivity of highly-doped regions, such as the gate electrode 102 and of contact areas of the deep drain/source regions 111, is increased by providing a metal compound on upper portions of these regions, since a metal-silicon compound may have a higher conductivity compared to an even highly doped silicon material. For example, titanium, cobalt and, in highly advanced devices, nickel is typically provided to form corresponding metal silicide regions of reduced resistivity. Prior to the deposition of any appropriate metal, such as nickel and the like, the corresponding surface portions have to be exposed, for instance when starting from the semiconductor device 100 as shown in FIG. 1b, and/or surface contamination may usually be removed when the surface portions under consideration are already substantially exposed, as is shown in FIG. 1c. In the embodiments in which the liner 108 is substantially comprised of silicon dioxide, the corresponding etch process for exposing the relevant surface portions and/or for removing contaminants, especially oxide residues, may be performed on the basis of a highly selective etch chemistry, which substantially does not affect the gate electrode 102 and the substrate 101 as well as the etch stop layer 110a. For instance, diluted fluoric acid (HF) may be used to remove oxide and oxide residues selectively to silicon and silicon nitride.

Figure 1D:
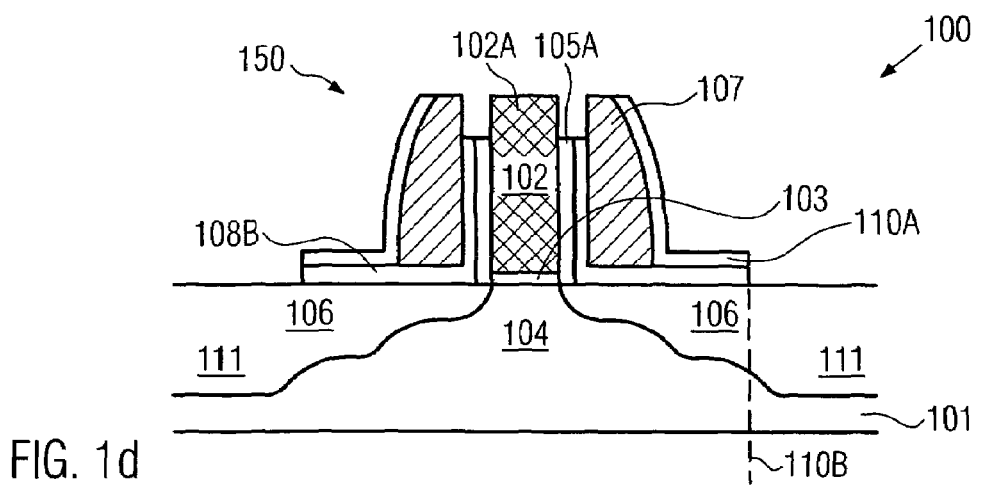

FIG. 1d schematically shows the semiconductor device 100 after a corresponding etch process to selectively remove surface contamination and/or to expose the respective surface portions. Moreover, in one particular embodiment, this highly selective etch process is also used to substantially completely remove the outer spacer element 109. As shown, the semiconductor device 100 comprises the liner 108a, that is now further reduced by the corresponding selective etch process, thereby creating a liner 108b. Moreover, due to the isotropic nature of the etch process, in some cases, an under-etch area may be formed that is vertically delineated by the etch stop layer 110a. Similarly, upper sidewall portions 102a of the gate electrode 102 may be exposed during the prolonged etch process, in which also the offset spacers 105 may be reduced if comprised of a material substantially identical to the liner 108b. The correspondingly reduced offset spacer is now indicated by 105a. In still other embodiments, the liner 108 and the outer spacer 109 may be comprised of dielectric materials other than silicon dioxide, such as silicon nitride, while the etch stop layer 110a may be comprised of silicon dioxide. In this case, substantially the same process flow may be used with an appropriate etch chemistry, such as hot phosphoric acid to remove the outer spacer 109 and to expose the surface portions of interest.

Thereafter, an appropriate metal may be deposited by sputter deposition on the basis of well-established recipes. For instance, cobalt, titanium, nickel or other refractory metals may be deposited based on device requirements. During the sputter deposition of the metal, which is a moderately directive deposition technique, the portion of the etch stop layer 110a also substantially prevents metal deposition. Consequently, except for the exposed upper sidewall portions 102a, the metal deposition is locally substantially restricted to areas that are substantially determined by the dimension of the outer spacer element 109, although removed, that is, by the lateral dimension 110b. During a subsequent heat treatment for initiating a chemical reaction between the deposited metal and silicon, metal silicide is preferably formed on the exposed silicon portions, such as the top surface and the upper sidewall portions 102a of the gate electrode 102 and the exposed surface portions of the substrate 101.

The formation of metal silicide in the drain/source region 111 is substantially determined by the lateral extension 110b of the etch stop layer 110a, as would be the case if the outer spacer 109 is still in place, even if an under-etch region may have been created, since also in this case metal penetration may significantly be hampered and metal diffusion towards the channel region 104 may also be significantly reduced. As a consequence, the formation of the metal suicide is restricted to portions of the drain/source regions 111 initially defined by the outer spacer 109 (FIGS. 1b and 1c), while at the same time material of a contact liner layer to be formed subsequently to the metal silicide formation may be brought closer to the channel region 104, thereby significantly enhancing the stress transfer mechanism for creating a desired strain in the channel region 104.

Figure 1E:
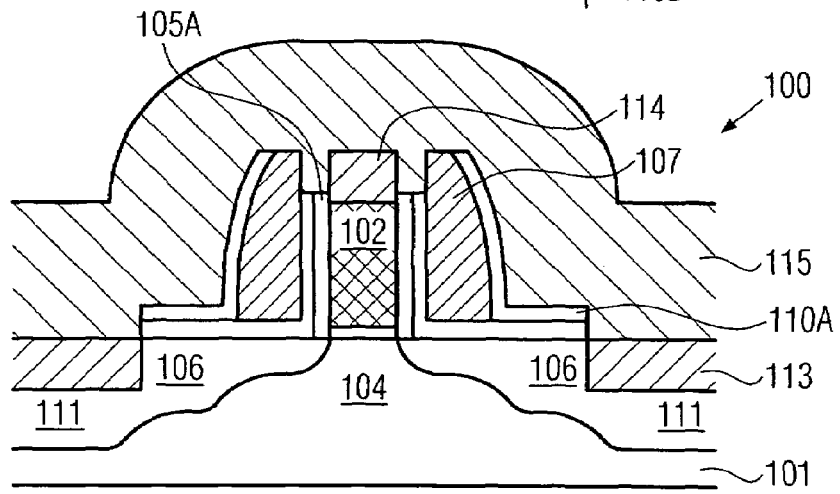

FIG. 1e schematically shows the semiconductor device 100 after the above-described process sequence. Thus, the device 100 comprises metal silicide regions 113 within the drain/source regions 111, the position and dimension of which is substantially defined by the outer spacer 109, i.e., by the etch stop layer 110a and its lateral extension 110b. Moreover, a corresponding metal suicide region 114 is formed on an upper portion of the gate electrode 102, wherein the reduced offset spacer 105a (FIG. 1d) provides an increased surface area, that is, the upper sidewall portions 102a, that is available for a conversion of silicon into metal silicide, thereby enabling a larger portion of the gate electrode 102 to be converted into a highly conductive material. Moreover, the device 100 comprises a contact liner layer 115, formed on the transistor element 150, which may, for instance, be comprised of silicon nitride and which may have a specified internal stress. As is well known, the deposition parameters, such as pressure, temperature, bias voltage and the like, during a PECVD process for depositing silicon nitride may be selected so as to obtain a specified internal stress ranging from approximately 1 GPa (Giga Pascal) of tensile stress to approximately 1 GPa of compressive stress. Consequently, a corresponding internal stress may be selected so as to efficiently produce a corresponding strain in the channel region 104, which may finally lead to an enhanced transistor operation. Moreover, since the process parameters of the PECVD process may be selected to obtain a highly non-directional deposition behavior, any under-etch region that may have been formed may also be filled, at least partially, to substantially avoid any voids within the dielectric material enclosing the transistor element 150.

As a result, by removing the outer spacer 109, which may be accomplished during a pre-cleaning process as is usually required prior to the formation of metal silicide, relevant portions of the contact liner layer 115 may be brought more closely to the channel region 104, thereby significantly enhancing stress transfer and thus charge carrier mobility increase. At the same time, a high degree of compatibility to conventional process techniques is maintained without negatively affecting the formation of the highly complex lateral dopant profile of the extension region 106 and the drain/source regions 111. Additionally, the increased surface area of the gate electrode 102, i.e., the upper sidewall portions 102a, that is exposed during the removal of the outer spacer 109 provides enhanced electrode conductivity, which may also contribute to a performance increase of the transistor 150.

Figure 2:
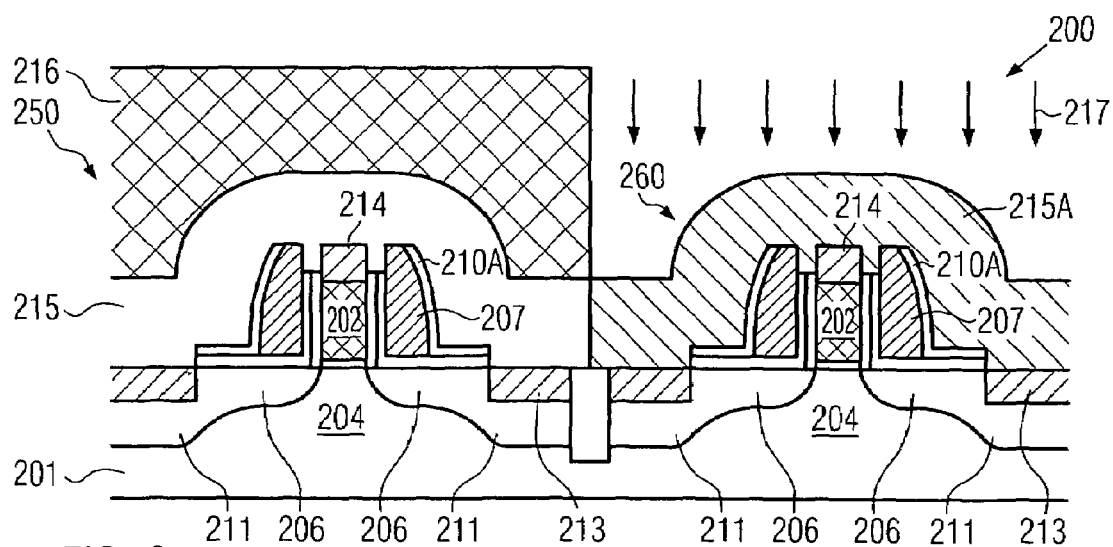
FIG. 2 schematically shows a cross-sectional view of a semiconductor device including two transistor elements receiving a contact liner layer close to the respective channel regions with a different internal stress in respective portions of the contact liner layer in accordance with still further illustrative embodiments of the present invention.

FIG. 2 schematically shows a cross-sectional view of a semiconductor device 200 in accordance with still further illustrative embodiments of the present invention. The semiconductor device 200 may comprise a first transistor element 250 and a second transistor element 260 formed above a substrate 201. Regarding the configuration of the substrate 201, the same criteria apply as previously explained with reference to the substrate 101. Moreover, the first and second transistor elements 250, 260 may comprise substantially the same components as previously described with respect to FIG. 1e. That is, the first and second transistor elements 250, 260 may comprise a gate electrode structure including a gate electrode 202 having formed thereon an offset spacer 205a separated from an inner spacer 207 by a liner 208b. A corresponding etch stop layer 210a may be formed on the inner spacer 207. For consistency, the spacers 207 of the first and second transistor elements 250, 260 will be referred to as "inner" spacer elements, although an "outer" spacer element is no longer provided at this manufacturing stage. Moreover, the first and second transistor elements 250, 260 may comprise a channel region 204 separated from the gate electrode 202 by a gate insulation layer 203. Extension regions 206 and deep source/drain regions 211 may be provided, wherein respective metal silicide regions, such as nickel silicide regions 213, are formed within the deep drain/source regions 211. A corresponding metal silicide region 214 may be formed on an upper portion of the gate electrode 202. The first and second transistor elements 250, 260 may differ from each other in the type of dopants used for forming the corresponding extension regions 206, the source/drain regions 211 and the channel regions 204 so that, for instance, the first transistor 250 may represent an N-channel transistor, whereas the second transistor 260 may represent a P-channel transistor. In other embodiments, the first and second transistors 250, 260 may, in addition or alternatively, differ in other transistor characteristics, such as gate length, thickness of the gate insulation layers 203 and the like. Moreover, a contact liner layer 215 is formed on the first and second transistor elements 250, 260. Finally, the first transistor element 250 may be covered by a resist mask 216.

A typical process flow for forming the semiconductor device 200, as shown in FIG. 2, may comprise substantially the same processes as are previously described with reference to the semiconductor device 100, wherein during the formation of the extension regions 206 and the source/drain regions 211, and in any previously performed implantation sequences to create an appropriate vertical dopant profile in the respective channel regions 204, appropriate masking steps may be performed to allow a different type of dopant to be introduced into the first and second transistor elements 250, 260. During the formation of the device 200, outer spacer elements may be provided prior to the corresponding implantation for the formation of the source/drain regions, which may be removed afterwards and prior to the formation of the metal silicide regions 214, 213, as is previously described with reference to FIGS. 1d and 1e. Furthermore, the contact liner layer 215 may be formed in accordance with any appropriate deposition technique to have a specified internal stress, which may be appropriately selected for performance increase of the first transistor element 250. For example, the internal stress of the contact liner layer 215 may be a tensile stress of appropriate magnitude to provide tensile strain in the channel region 204 of the first transistor element 250, when this transistor element represents an N-channel transistor, since tensile strain may increase electron mobility. After the formation of the contact liner layer 215, the resist mask 216 may be formed based on any photolithography masks that may also be used in the formation of different types of extension regions 206 and source/drain regions 211. Thereafter, the device 200 may be subjected to a treatment 217 that is designed to form a contact liner layer portion 215a above the second transistor element 260, which exhibits an internal stress that differs from that of the contact liner layer 215 formed above the first transistor element 250.

In one illustrative embodiment, the treatment 217 may comprise an ion implantation process with any appropriate ion species, such as xenon, argon and the like, which may modify the internal structure of the contact liner layer 215 as deposited, thereby creating a certain degree of stress relaxation. For example, tensile stress may have a negative influence on the hole mobility in the channel region of a P-channel transistor and, thus, by applying the treatment 217 for stress relaxation, the channel region 204 of the second transistor element 260 may be substantially not affected by the initially created stress of the layer 215. In other embodiments, the layer 215 may be formed with inherent compressive stress, for instance when the first transistor element 250 represents a P-channel transistor, and the compressive stress may then be relaxed by the treatment 217 so as to avoid or at least reduce the effects of the compressive stress on the channel region 204 of the second transistor element 260, which may represent an N-channel transistor. Thus, performance of the P-channel transistor 250 may be enhanced most efficiently due to the close proximity of the stressed layer 215 to the respective channel region 204, whereas the effect of the compressive stress on the N-channel transistor 260 may be adjusted in accordance with device requirements. In particular, the stress relaxation may be controlled by appropriately controlling the treatment 217 to achieve an enhanced degree of symmetry during operation of the transistors 250 and 260.

In other illustrative embodiments, the treatment 217 may comprise the removal of the portion 215a by any appropriate etch process and, thereafter, the portion 215a may be replaced by a further contact liner layer having a desired internal stress to significantly improve the performance of the second transistor element 260. Hereby, the further contact liner layer may also be deposited above the first transistor element 250, thereby possibly attenuating the effect of the initially deposited contact liner layer 215, which may, however, be taken into consideration when adjusting the magnitude of the inherent stress of the initially deposited contact liner layer 215.

As a result, the present invention provides an improved technique for transferring stress from a contact liner layer to the channel region of transistor elements wherein, by removal of an outer spacer element used for creating an appropriate lateral dopant profile, close proximity of the contact liner layer to a channel region is accomplished. Moreover, the removal process may be performed prior to the formation of metal silicide regions and thus a high degree of compatibility with conventional process flows may be obtained while at the same time a pre-cleaning process performed prior to the metal deposition may advantageously be used to also remove the outer spacer. Moreover, the removal process of the outer spacer may also expose an increased portion of the gate electrode, thereby additionally enhancing the metal silicide formation in the gate electrode, which may lead to an increased conductivity thereof. The removal of the outer spacer in combination with the metal silicide pre-clean process is performed in the front end of line (FEoL) and therefore any metallic cross-contamination may be prevented.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a transistor element comprising a gate electrode structure including at least an inner spacer element and an outer spacer element, wherein forming said transistor element comprises:
    forming a gate electrode above a semiconductor region;
    forming said at least one inner spacer element adjacent the sidewalls of said gate electrode;
    forming an etch stop layer to separate said at least one inner spacer element and said outer spacer element; and
    forming drain/source regions using said inner and outer spacer elements as the implantation mask; and
    wherein forming said outer spacer element comprises depositing said etch stop layer, depositing a spacer material layer, anisotropically etching said spacer material layer to form said outer spacer element and etching said etch stop layer using said outer spacer element as an etch mask;
    removing said outer spacer element;
    forming a contact liner layer above said transistor element; and
    forming a silicide region on said gate electrode and said drain/source region prior to forming said contact liner layer, wherein said outer spacer element is removed prior to forming said silicide region.

2. The method of claim 1, wherein forming said contact liner layer comprises depositing a dielectric material, using deposition parameters to achieve a predefined internal stress in said contact liner layer.

3. The method of claim 1, further comprising performing a cleaning process prior to forming said silicide region.

4. The method of claim 3, wherein said cleaning process is performed on the basis of an etch chemistry configured to selectively etch said outer spacer element with respect to said etch stop layer.

5. The method of claim 4, wherein said cleaning process is controlled so as to substantially completely remove said outer spacer element.

6. The method of claim 1, further comprising forming an offset spacer element adjacent said sidewalls of said gate electrode prior to forming said inner and outer spacer elements.

7. The method of claim 6, further comprising forming a liner prior to forming said inner spacer element, said liner being configured to act as an etch stop layer during the formation of said inner spacer element.

8. The method of claim 1, wherein said inner spacer element is comprised of one of silicon dioxide and silicon nitride.

9. The method of claim 1, wherein said outer spacer element is comprised of one of silicon nitride and silicon dioxide and said etch stop layer is comprised of the other one of said silicon nitride and silicon dioxide.

10. A method, comprising:
    forming a first transistor element having a first gate electrode structure including at least an inner and an outer spacer element;
    forming a second transistor element having a second gate electrode structure including at least an inner and an outer spacer element, wherein forming said outer spacer elements comprises depositing an etch stop layer, depositing a spacer material layer, anisotropically etching said spacer material layer to form said outer spacer elements and etching said etch stop layer using said outer spacer element as an etch mask;
    removing said outer spacer elements of said first and second gate electrode structures;

forming a first contact liner layer having a first internal stress above said first transistor element and a second contact liner layer having a second internal stress above said second transistor element; and forming a silicide region on said first and second gate electrodes and drain/source regions of said first and second transistor elements prior to forming said contact liner layer, wherein said outer spacer elements are removed prior to forming said silicide regions.

11. The method of claim 10, wherein said first and second internal stresses are different.

12. The method of claim 10, wherein forming said first and second contact liner layers comprises depositing a contact liner layer having said first internal stress above said first and second transistor elements and selectively relaxing said contact liner layer formed above said second transistor element to obtain said second internal stress.

13. The method of claim 10, wherein forming said first and second contact liner layers comprises depositing a contact liner layer having said first internal stress above said first and second transistor elements, selectively removing a portion of the contact liner layer above said second transistor element and depositing a further contact liner layer having said second internal stress above said first and second transistor elements.

14. The method of claim 10, wherein forming said first and second transistor elements comprises:

forming a first and second gate electrode above a semiconductor region;

forming said at least one inner spacer element adjacent the sidewalls of said first and second gate electrodes;

forming an etch stop layer to separate said at least one inner spacer element and said outer spacer element; and forming drain/source regions using said inner and outer spacer elements as the implantation mask.

15. The method of claim 10, wherein forming said contact liner layer comprises depositing a dielectric material, using deposition parameters to achieve a predefined internal stress in said contact liner layer.

16. The method of claim 10, further comprising performing a cleaning process prior to forming said silicide regions.

17. The method of claim 16, wherein said cleaning process is performed on the basis of an etch chemistry configured to selectively etch said outer spacer elements with respect to said etch stop layer.

18. The method of claim 17, wherein said cleaning process is controlled so as to substantially completely remove said outer spacer elements.

19. The method of claim 15, further comprising forming an offset spacer element prior to forming said inner and outer spacer elements.

* * * * *